US011742311B2

United States Patent
Scuderi et al.

(10) Patent No.: US 11,742,311 B2
(45) Date of Patent: Aug. 29, 2023

(54) INTEGRATED CIRCUIT AND ELECTRONIC DEVICE COMPRISING A PLURALITY OF INTEGRATED CIRCUITS ELECTRICALLY COUPLED THROUGH A SYNCHRONIZATION SIGNAL

(71) Applicant: STMicroelectronics S.r.l., Agrate Brianza (IT)

(72) Inventors: Angelo Scuderi, Catania (IT); Nicola Marinelli, Mediglia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/162,595

(22) Filed: Jan. 29, 2021

(65) Prior Publication Data

US 2021/0242157 A1    Aug. 5, 2021

(30) Foreign Application Priority Data

Jan. 30, 2020    (IT) .................... IT102020000001819

(51) Int. Cl.
*H01L 23/538* (2006.01)
*H01L 23/00* (2006.01)
*H01L 23/66* (2006.01)
*H01L 25/065* (2023.01)
*H01L 25/10* (2006.01)

(52) U.S. Cl.
CPC .......... *H01L 24/17* (2013.01); *H01L 23/5386* (2013.01); *H01L 23/66* (2013.01);
(Continued)

(58) Field of Classification Search
CPC ......... H01L 24/14; H01L 24/16; H01L 24/17; H01L 24/20; H01L 24/48; H01L 23/66;
(Continued)

(56) References Cited

U.S. PATENT DOCUMENTS 5,849,606 A * 12/1998 Kikuchi .................. H01L 24/81
438/126
6,057,600 A * 5/2000 Kitazawa ................ H01L 23/66
257/691

(Continued)

FOREIGN PATENT DOCUMENTS

EP      3273475 A2    1/2018
JP    2015079892 A    4/2015

OTHER PUBLICATIONS

Wojnowski et al., "A 77 GHz SiGe Mixer in an Embedded Wafer Level BGA Package," 2008 Electronic Components and Technology Conference, pp. 290-296.

*Primary Examiner* — Khiem D Nguyen
(74) *Attorney, Agent, or Firm* — Seed Intellectual Property Law Group LLP

(57) ABSTRACT

An electronic device has a plurality of integrated circuits fixed to a support between transmitting and receiving antennas. An integrated circuit generates a synchronization signal supplied to the other integrated circuits. Each integrated circuit is formed in a die integrating electronic components and overlaid by a connection region according to the Flip-Chip Ball-Grid-array or embedded Wafer Level BGA. A plurality of solder balls for each integrated circuit is electrically coupled to the electronic components and bonded between the respective integrated circuit and the support. The solder balls are arranged in an array, aligned along a plurality of lines parallel to a direction, wherein the plurality of lines comprises an empty line along which no solder balls are present. A conductive synchronization path is formed on the support and extends along the empty line of at least one integrated circuit, between the solder balls of the latter.

20 Claims, 7 Drawing Sheets

(52) U.S. Cl.
CPC .............. *H01L 24/14* (2013.01); *H01L 24/16* (2013.01); *H01L 24/48* (2013.01); *H01L 24/73* (2013.01); *H01L 25/0655* (2013.01); *H01L 25/105* (2013.01); *H01L 2223/6627* (2013.01); *H01L 2223/6677* (2013.01); *H01L 2223/6683* (2013.01); *H01L 2224/14133* (2013.01); *H01L 2224/16225* (2013.01); *H01L 2224/17133* (2013.01); *H01L 2224/48105* (2013.01); *H01L 2224/48225* (2013.01); *H01L 2224/73257* (2013.01); *H01L 2924/1423* (2013.01)

(58) Field of Classification Search
CPC ........... H01L 23/5386; H01L 23/49816; H01L 23/49838; H01L 25/105; H01L 25/0655; H01L 2924/15192; H01L 2924/15311; H01L 2924/16251; H01L 2924/18162; H01L 2924/1903; H01L 2924/19032; H01L 2924/19033; H01L 2224/14133; H01L 2223/6627; H01L 2223/6677; H01L 2223/6683; H01L 23/488; H01L 23/5227; H01L 24/73; H01L 25/106
USPC ......................................................... 257/738
See application file for complete search history.

(56) References Cited

U.S. PATENT DOCUMENTS

| | | | |
|---|---|---|---|
| 6,770,955 B1 | 8/2004 | Coccioli et al. | |
| 7,242,093 B2* | 7/2007 | Ueda | H01L 23/49838 257/E23.079 |
| 8,846,520 B2* | 9/2014 | Matsuda | H01L 24/03 257/738 |
| 10,038,232 B2* | 7/2018 | Dang | H01L 25/0655 |
| 10,121,751 B2* | 11/2018 | Lachner | H01L 23/3135 |
| 10,199,335 B2* | 2/2019 | Ishibashi | H01L 23/49811 |
| 2005/0002167 A1* | 1/2005 | Hsuan | H01L 25/165 257/E25.031 |
| 2007/0141751 A1* | 6/2007 | Mistry | H01L 24/97 257/E23.114 |
| 2012/0289002 A1* | 11/2012 | Tomita | H01L 23/3675 438/122 |
| 2013/0016029 A1 | 1/2013 | Tsutsumi | |
| 2013/0207262 A1* | 8/2013 | Lachner | H01Q 9/045 257/738 |
| 2013/0207274 A1 | 8/2013 | Liu et al. | |
| 2013/0241059 A1* | 9/2013 | Boeck | H01L 23/49816 257/738 |
| 2014/0110841 A1* | 4/2014 | Beer | H01L 23/49816 257/738 |
| 2017/0263578 A1 | 9/2017 | Ishibashi | |
| 2017/0309587 A1* | 10/2017 | Nakashiba | H01L 23/49838 |
| 2018/0025985 A1 | 1/2018 | Lin et al. | |
| 2018/0138132 A1 | 5/2018 | Nishizawa et al. | |
| 2019/0293784 A1* | 9/2019 | Khalid | G01S 13/87 |
| 2020/0176393 A1 | 6/2020 | Ketterson | |
| 2020/0176416 A1* | 6/2020 | Ketterson | H01L 21/565 |
| 2021/0234526 A1 | 7/2021 | Kim et al. | |
| 2021/0242116 A1 | 8/2021 | Scuderi et al. | |
| 2021/0313285 A1 | 10/2021 | Noori et al. | |
| 2021/0313286 A1 | 10/2021 | Watts et al. | |

\* cited by examiner

INTEGRATED CIRCUIT AND ELECTRONIC DEVICE COMPRISING A PLURALITY OF INTEGRATED CIRCUITS ELECTRICALLY COUPLED THROUGH A SYNCHRONIZATION SIGNAL

BACKGROUND

Technical Field

The present disclosure relates to an integrated circuit and to an electronic device comprising a plurality of integrated circuits electrically coupled through a synchronization signal.

Description of the Related Art

In particular, electronic devices of this type are used in radiofrequency applications, for example, in radars for use in motor vehicles (typically, in the 76 to 81 GHz frequency range), where a number of transmission and/or receiving channels are present, and/or in imaging applications, for example, for medical use.

In these types of multiple-channel applications, currently MMICs (Monolithic Microwave Integrated Circuits) are increasingly used by virtue of their uniform electrical characteristics (typically, they are matched to an impedance of 50Ω), which cause them to be simple to use, as they may be easily cascade-connected without any need for external impedance-matching networks.

In this way, it is possible to manufacture devices formed by a plurality of cascade-connected MMICs, each whereof is configured to manage a small number of transmitting/receiving channels. For instance, the MMICs may be connected together so that a first MMIC (referred to as Master) generates synchronization signals and supplies these signals to all the other MMICs (referred to as Slaves). In particular, the Master generates a synchronization signal LO, at more or less high frequencies, according to the application (for example, at 20, 40, or 80 GHz). With this arrangement, all the MMICs receive the synchronization signal LO from the Master and are able to transmit and receive radiofrequency signals in a synchronized way, using transmitting and receiving antenna connections.

For instance, in this way, a high end radar device is able to manage twelve receiving channels (hereinafter referred to as "RX channels") and nine transmitting channels (hereinafter referred to as "TX channels"), using three MMICs (one Master and two Slaves) that are each able to manage four RX channels and three TX channels. In more general terms, a radar device of this type is able to manage X RX channels and Y TX channels, using M MMICs that are each able to manage X/M RX channels and Y/M TX channels.

In general, moreover, a MMIC-based device for transmitting/receiving radiofrequency signals comprises a printed-circuit board (PCB) carrying the MMICs and the antennas, and may have a layout of the type shown in FIG. 1 and described hereinafter.

For instance, FIG. 1 shows a device 1 comprising a printed-circuit board (PCB 2) carrying one Master MMIC 3 and three Slave MMICs 4-6 (even though the number of MMICs may be greater or smaller). In the top plan view of FIG. 1, the MMICs 3-6 are set side-by-side, between a receiving antenna structure (RX antenna 10, at the top in FIG. 1) and a transmitting antenna structure (TX antenna 11, at the bottom in FIG. 1).

The high-frequency MMICs 3-6 are generally fixed to the PCB 2 and electrically connected together through solder ball connections, as described in greater detail hereinafter. The PCB 2 has surface electrical connections 13, generally formed as conductive tracks on the surface of the PCB 2, for electrical connection of the MMICs 3-6 to the RX antenna 10 and the TX antenna 11; buried electrical connections 14, formed by conductive tracks generally extending in internal layers of the PCB 2; and connection vias, for connecting the different levels and the surface of the PCB 2, for exchanging signals and electrical quantities between the MMICs 3-6, in a known manner and shown only schematically in FIG. 1.

In radiofrequency applications, due to the high working frequency (generally, higher than 40 GHz), the solder ball connections are currently implemented through a FC-BGA (Flip Chip-Ball Grid Array) technique or an eWLB (embedded Wafer-Level BGA) technique.

As is known, both techniques use ball-grid arrays 15 fixed on one side, for example, on the backside, of each MMIC 3-6 to be coupled to the PCB 2, as exemplary shown in FIG. 2, where the solder balls are designated by 15 and the generic MMIC is designated by 16.

In case of the FC-BGA technique (see FIG. 3, which is a cross-section through a generic MIMIC 16), the solder balls 15 are fixed to one side of a connection substrate 7 formed by two plates 8 housing dielectric material 9. The dielectric material 9 embeds metal connection lines 18, which electrically connect the solder balls 15 with bumps 17 fixed to the connection substrate 7 on the side opposite to the solder balls 15. Furthermore, the bumps 17 are fixed to a die 21 housing electronic components (designated as a whole by 22) and enable passage of signals and possible other electrical quantities (for example, supply quantities, hereinafter included in the term "signals") between the electronic components 22 of each MIMIC 3-6 and the connection substrate 7. A dielectric filling and matching layer (so-called underfill layer 19) extends between the die 21 and the connection substrate 7 and covers the bumps 17. A cap 12 is bonded to the connection substrate 7 through an adhesive layer 23 and surrounds the die 21, the bumps 17, and the underfill layer 19, to form a sort of package with the connection substrate 7.

In case of the eWLB technique (see FIG. 4 showing a cross-section through a portion of the generic MMIC 16), each solder ball 15 is generally fixed to a respective conductive region 25. The conductive regions 25 (just one whereof is shown) are made generally of copper within a dielectric layer 26 and form one or more redistribution layers (in FIG. 4, a single redistribution layer RDL 24). The dielectric layer 26 extends over a passivation layer 27 that covers a die 28 except for openings at the contact pads 30 formed on the surface of the die 28 and electrically connected to electronic components (designated as a whole by 31) integrated in the die 28. Here, the die 28 is surrounded by a peripheral region 29. The peripheral region 29 is generally manufactured by compression molding and widens the area of the die 28, so that the dielectric layer 26 (which also extends over the peripheral region 29) nay have an greater area than the die 28, enabling the solder balls 15 to be arranged over an area wider than the die 28, for example, at a pitch of 500 μm.

The eWLB technique allows to obtain the minimum length of the interconnections and a very good electrical behavior up to high frequencies (with a wavelength in the field of millimeters), does not require underlying filling with underfill material, makes it possible to have numerous input/output connections, and has a low cost.

Among the signals exchanged between the MMICs 3-6, of particular importance is the synchronization signal LO, since it makes it possible to maintain phase coherence and amplification balancing between the MMICs 3-6.

Currently, the synchronization signal LO (having two different inputs to enable a symmetrical routing in the PCB 2) is routed through the buried connections 14 using an internal additional layer of the PCB 2, since these synchronization connections cannot be formed on the top layer of the PCB 2 in order not to cross the surface electrical connections 13 with the RX antenna 10 and the TX antenna 11 (FIG. 1).

This, however, entails an increase in the complexity of the buried connections 14 and high costs for forming the internal additional layer of the PCB 2. Furthermore, transitions between the various layers increase, which leads to undesirable drops in signal amplitudes.

BRIEF SUMMARY

The present disclosure provides an integrated circuit and an electronic device that overcomes the drawbacks of the prior art, using the current connection techniques, for example, the ones based upon solder balls.

According to the present disclosure an integrated circuit and an electronic device are provided.

In at least one embodiment, an integrated circuit package is provided that includes a die including semiconductor material and integrated electronic components. A connection region overlies the die. A plurality of solder balls is fixed to the connection region and electrically coupled to the electronic components, and the solder balls are arranged in an array and being aligned along a plurality of lines parallel to a direction. The plurality of lines includes an empty line along which no solder balls are present.

In at least one embodiment, an electronic device is provided that includes a support having a face, and a plurality of integrated circuits. Each of the integrated circuits has integrated electronic components. A plurality of solder balls is included for each integrated circuit, and the plurality of solder balls is electrically coupled to the electronic components of the respective integrated circuit and the solder balls are fixed between the face of the support and the respective integrated circuit. Antenna structures are disposed on the face of the support. Electric connection paths are disposed on the face of the support and electrically couple the antenna structures to first solder balls of the plurality of solder balls of each integrated circuit. The pluralities of solder balls of each integrated circuit are arranged in an array and are aligned along a plurality of lines parallel to a direction, and the plurality of lines includes an empty line where no solder balls are present. A conductive synchronization path extends over the face of the support and is electrically coupled to at least a first solder ball of each integrated circuit. The conductive synchronization path has at least a first portion extending along the empty line of at least one integrated circuit of the plurality of integrated circuits.

In at least one embodiment, a device is provided that includes a printed circuit board (PCB) having a surface, and semiconductor device package physically to the surface of the PCB. The semiconductor device package includes a semiconductor die having integrated electronic components, a connection region on the semiconductor die, and a plurality of solder balls connected to the connection region and electrically coupled to the electronic components. The solder balls are arranged in an array and are aligned along a plurality of lines parallel to a direction. The plurality of lines includes an empty line along which no solder balls are present.

BRIEF DESCRIPTION OF THE SEVERAL VIEWS OF THE DRAWINGS

For a better understanding of the present disclosure, some embodiments thereof are now described, purely by way of non-limiting example, with reference to the attached drawings, wherein.

DETAILED DESCRIPTION

Figure 5:
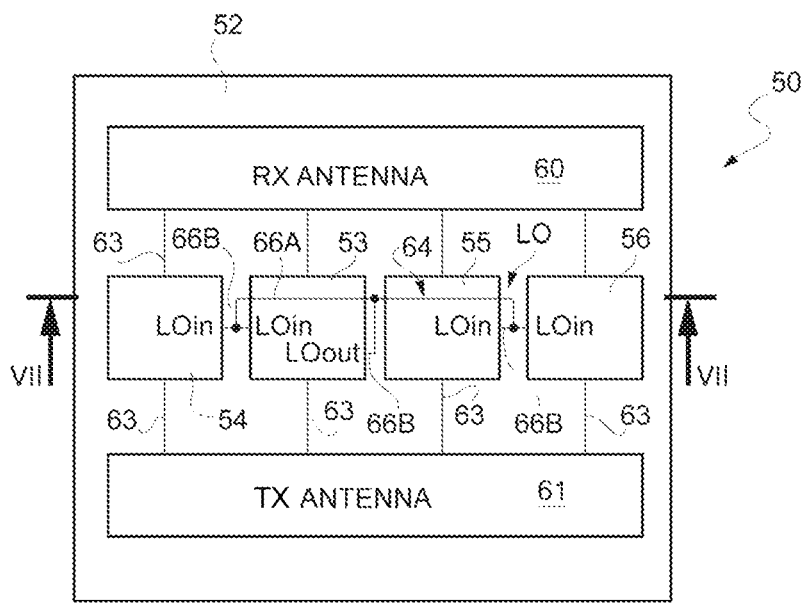
FIG. 5 shows the layout of an electronic device having a plurality of integrated circuits, according to an embodiment.

FIG. 5 shows an electronic device 50 comprising a printed-circuit board, PCB 52, carrying four MMICs, for example, one Master MIMIC 53 and three Slave MMICs 54-56 (even though the number of Slave MMICs may be different). In the top plan view of FIG. 5, the MMICs 53-56 are arranged side-by-side, between a receiving antenna structure (RX antenna 60, at the top in FIG. 5) and a transmitting antenna structure (TX antenna 61, at the bottom in FIG. 5).

Figure 1:
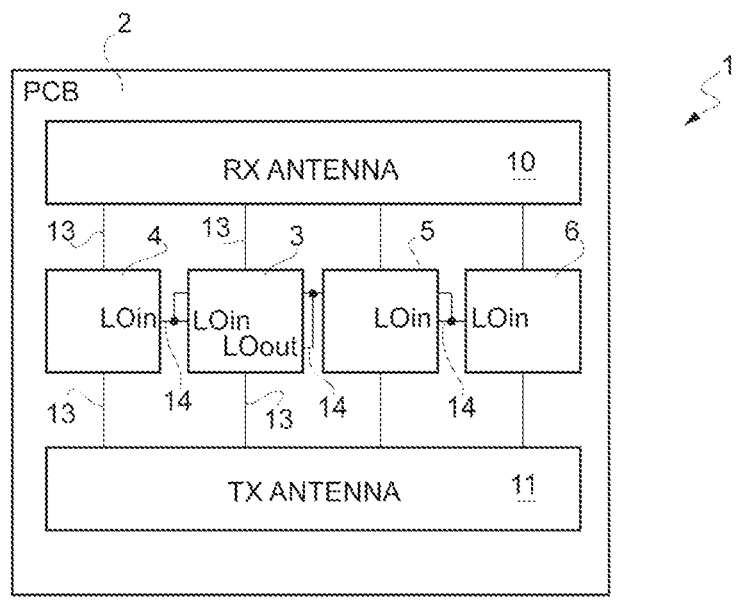
FIG. 1 shows the layout of an electronic device having a plurality of integrated circuits for radiofrequency applications of a known type.
Figure 2:
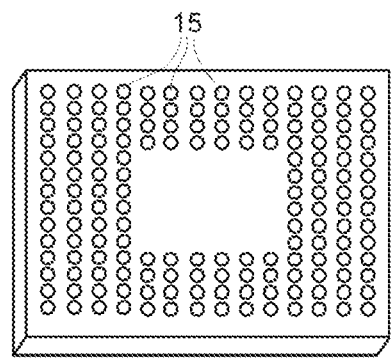
FIG. 2 is a bottom perspective view of an integrated circuit configured to be bonded using the ball-grid-array technique.
Figure 3:
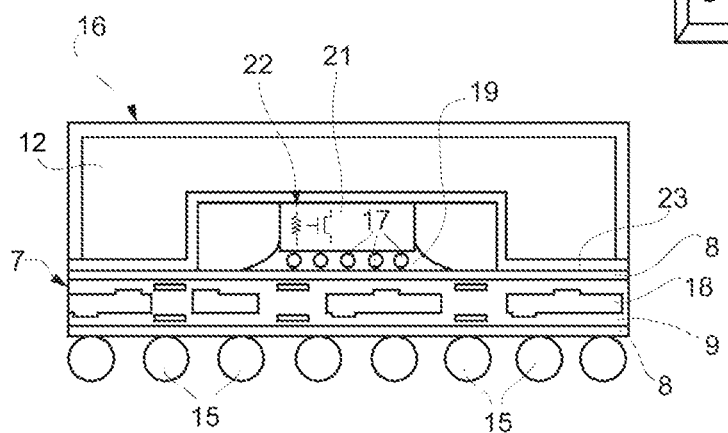
FIG. 3 is a cross-section of a portion of the integrated circuit of FIG. 2, configured to be bonded using the FC-BGA technique.
Figure 4:
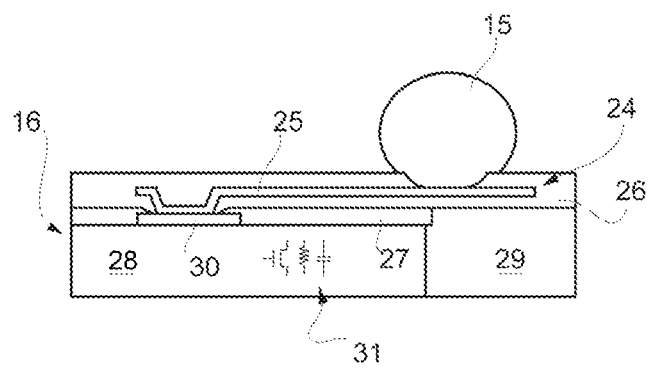
FIG. 4 is a cross-section of a portion of the integrated circuit of FIG. 2, configured to be bonded using the eWLB technique.
Figure 7:
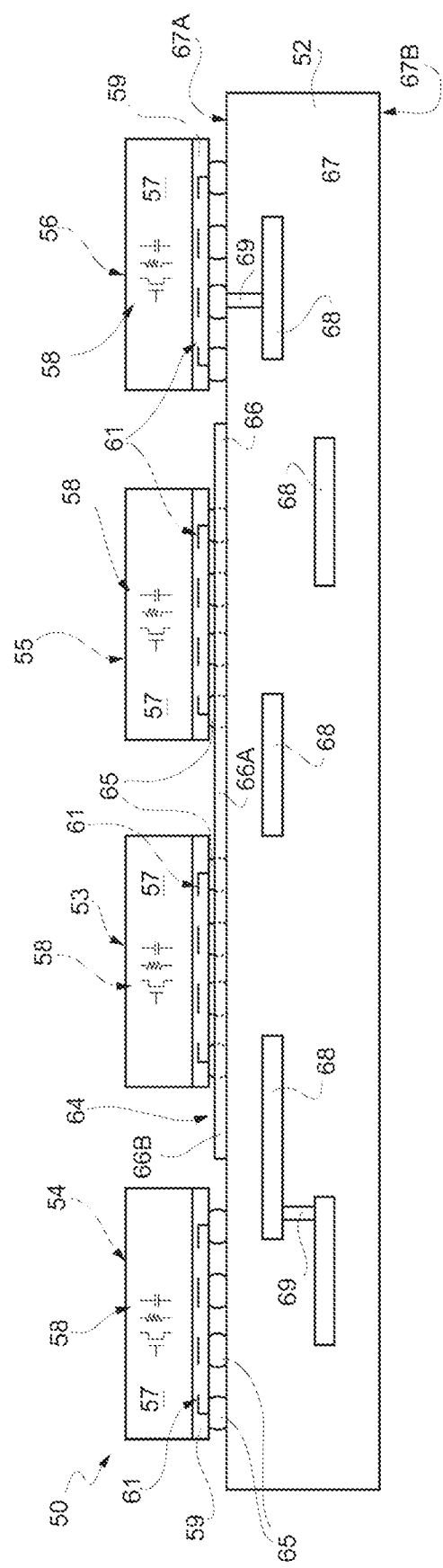
FIG. 7 is a cross-section of a portion of the integrated circuit of FIG. 5.

With reference to FIG. 7, the MMICs 53-56 comprise a semiconductor device package 57 (which, in some embodiments, may be referred to as a die 57) housing electronic components (represented schematically and designated as a whole by 58). A connection region 59 extends over the die 57. In case of the eWLB bonding technique, the connection region is formed by a dielectric layer accommodating metal connection lines 61, as described above with reference to FIG. 4. In case of the FC-BGA bonding technique, the connection region 59 is formed by a bonding support similar to the bonding support 7 of FIG. 3. Not visible in FIG. 7 are possible passivation layers, nor a possible peripheral region surrounding the die 57, in case of the eWLB bonding technique, or the underfill layer and bumps, in case of the FC-BGA bonding technique, but they may be present, as shown in FIGS. 4 and 3, respectively.

With reference once again to FIG. 5, the MMICs 53-56 are connected to the RX antenna 60 and the TX antenna 61 through surface electrical connections 63, formed as conductive tracks on the surface of the PCB 52 that carries the MMICs 53-56, in a known way. In addition, the MMICs 53-56 are mutually connected through buried connections, formed in the PCB 52, as described hereinafter, as well as through a synchronization line 64, described in detail hereinafter, which routes a synchronization signal LO, generated by the Master MMIC 53, through the electronic components 74 and supplied to the Slave MMICs 54-56 for their synchronization and amplitude balancing, in a per se known manner.

Hereinafter, to enable better understanding, the Slave MMICs 54-56 are also referred to as first, second, and third Slave MMICs 54, 55, and 56. In the embodiment shown (see, in particular, FIG. 5), the Master MMIC 53 is arranged between the first Slave MMIC 54 (located to the left) and the second Slave MMIC 55 (located to the right). Consequently, the synchronization signal LO crosses the Master MMIC 53 and the second Slave MMIC 55.

The MMICs 53-56 (see also FIGS. 6 and 7) are fixed and electrically connected to the PCB 52 through the solder ball technique, which uses solder balls 65. The solder balls 65 may be bonded either using the FC-BGA technique or using the eWLB technique described above and shown in FIGS. 3 and 4. It should be noted that hereinafter the term "balls" will be used, even though, after bonding, in general they are deformed and have a shape different from the spherical one.

Figure 6:
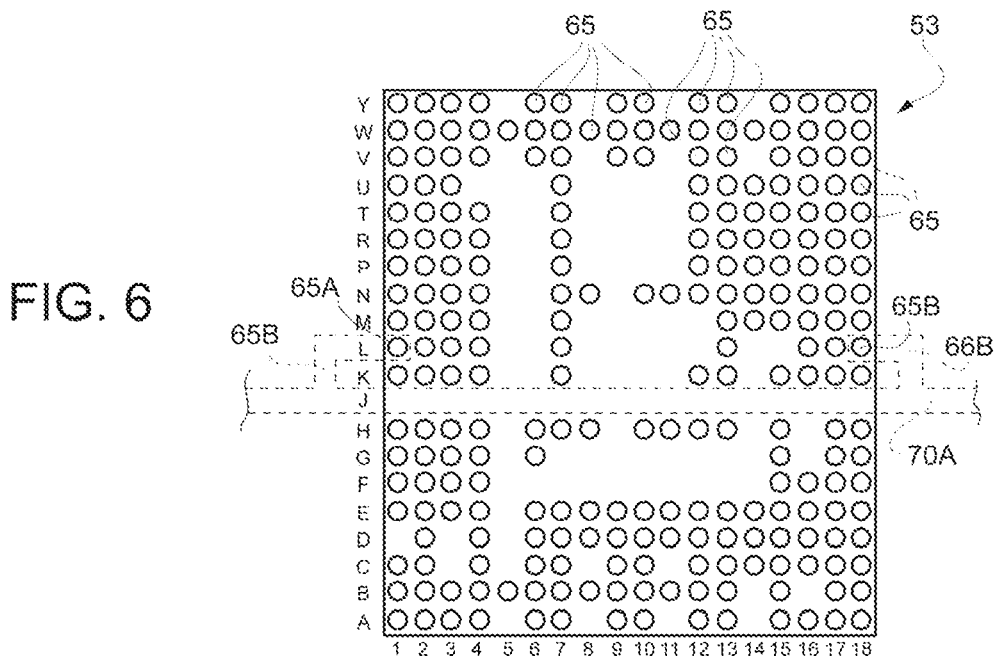
FIG. 6 is a bottom view of the integrated circuit of FIG. 5.

As may be noted in FIG. 6, the solder balls 65 are arranged in rows and columns, identified in FIG. 6 by the letters A-Y and the numbers 1-18, respectively, but on the row J no solder balls 65 are present.

Figure 6A:
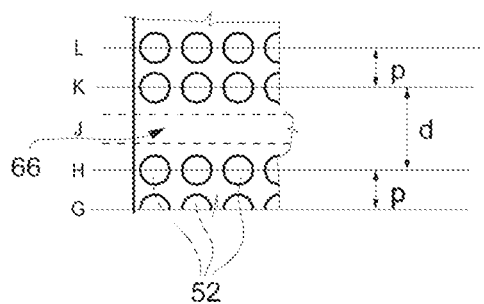
FIG. 6A shows an enlarged detail of the integrated circuit of FIG. 6.

In this way, the row J defines an empty or missing row, i.e., the solder balls 65 arranged on the adjacent rows (rows K and H in FIG. 6) are arranged at a distance from each other greater than the distance between the other adjacent rows. In particular, with reference to the enlarged detail of FIG. 6A, if p denotes the pitch between adjacent rows in the array (i.e., the distance between the central points of solder balls 65 belonging to mutually adjacent rows), at the empty row the distance d is twice the pitch p (d=2p).

As represented by a dashed line in FIG. 6, the synchronization line 64 extends (on the PCB 52) in the empty row, between two rows of solder balls 65 arranged at the distance d.

With reference to FIG. 7, the PCB 52 comprises, in a known way, a body 67 of dielectric material, which has a first face 67A and a second face 67B and embeds conductive regions 68 connected together and to the first face 67A through metal vias 69 for electrical connection between the MMICs 53-56. Possible vias (not shown) may connect the conductive regions 68 also to the second face 67B of the PCB 52. The first face 67A of the PCB 52 moreover carries the surface electrical connections 63 (here not visible) and the synchronization line 64.

In particular (see also FIG. 5), the synchronization line 64 is here formed by a synchronization track 66 comprising a rectilinear portion 66A and branching portions 66B extending from the rectilinear portion 66A as far as respective solder balls 65 arranged at the terminals of the MMICs 53-56 intended to receive/emit the synchronization signal LO (denoted in FIG. 5 by LOin for the input terminals and by LOout for the output terminals). For instance, the branching portions 66B connecting to the solder ball 65A coupled to the input terminal LOin and to the output terminal LOout of the Master MMIC 53 of FIG. 5 are represented by dashed lines in FIG. 6.

In practice, in the embodiment shown in FIG. 5, the rectilinear portion 66A of the synchronization line 64 extends only underneath the Master MMIC 53 and the second Slave MIMIC 85, even though all the MMICs 53-56 have the empty row, and the branching portions 66B are connected to two solder balls 65 (solder balls 65A and 65B in FIG. 6) for the Master MIMIC 53 and to a single solder ball 65 for the MMICs 54-56.

However, the rectilinear portion 66A is not necessarily formed by a single segment that traverses the Master MIMIC 53 and the second Slave MIMIC 85, but may be formed by a broken line, only the portions thereof crossing the single MMICs 53 and 55 being preferably linear.

The synchronization track 66 may be formed in the same way as the surface electrical connections 63 formed on the first face 67A of the PCB 52, for example, as a copper track, and typically has a much lower thickness than the solder balls 65, even when these are slightly deformed after soldering, as visible in FIG. 7.

Figure 8:
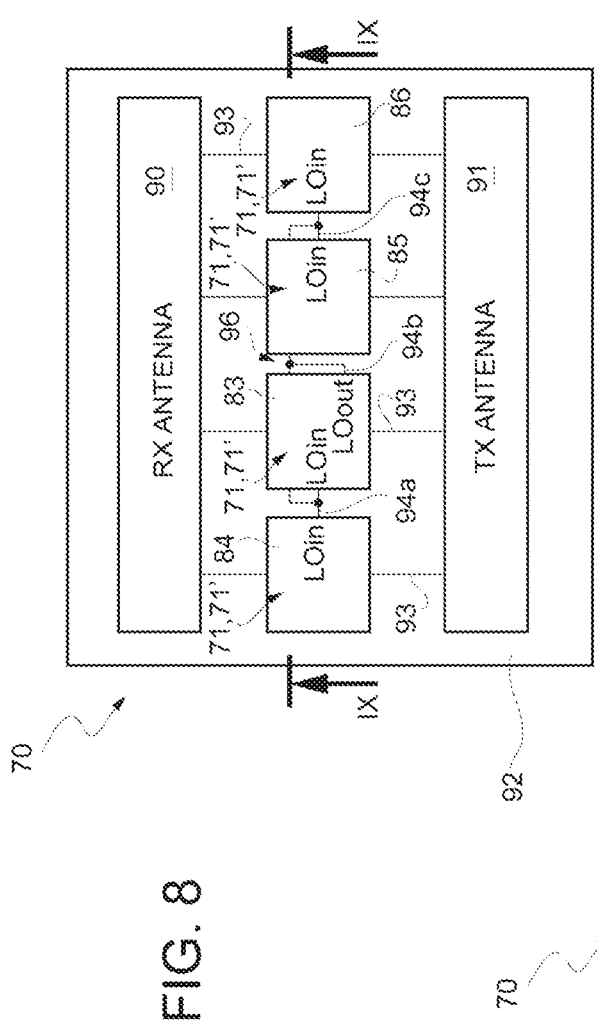
FIG. 8 shows the layout an electronic device having a plurality of integrated circuits according to another embodiment.
Figure 9:
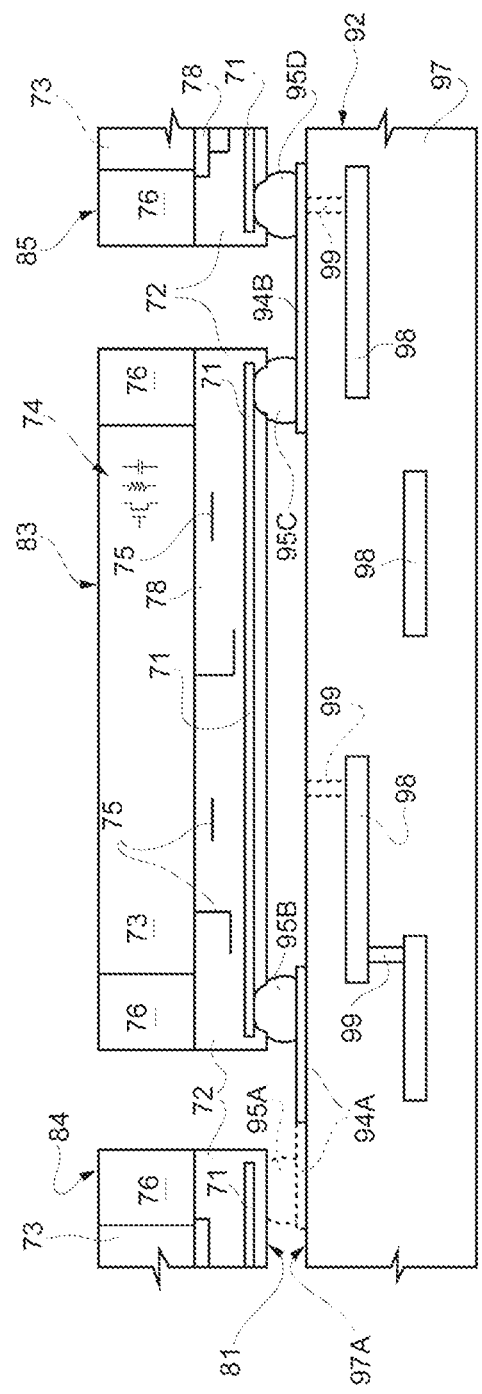
FIG. 9 is a cross-section of a portion of an integrated circuit of the electronic device of FIG. 8, taken along section line IX-IX.
Figure 10:
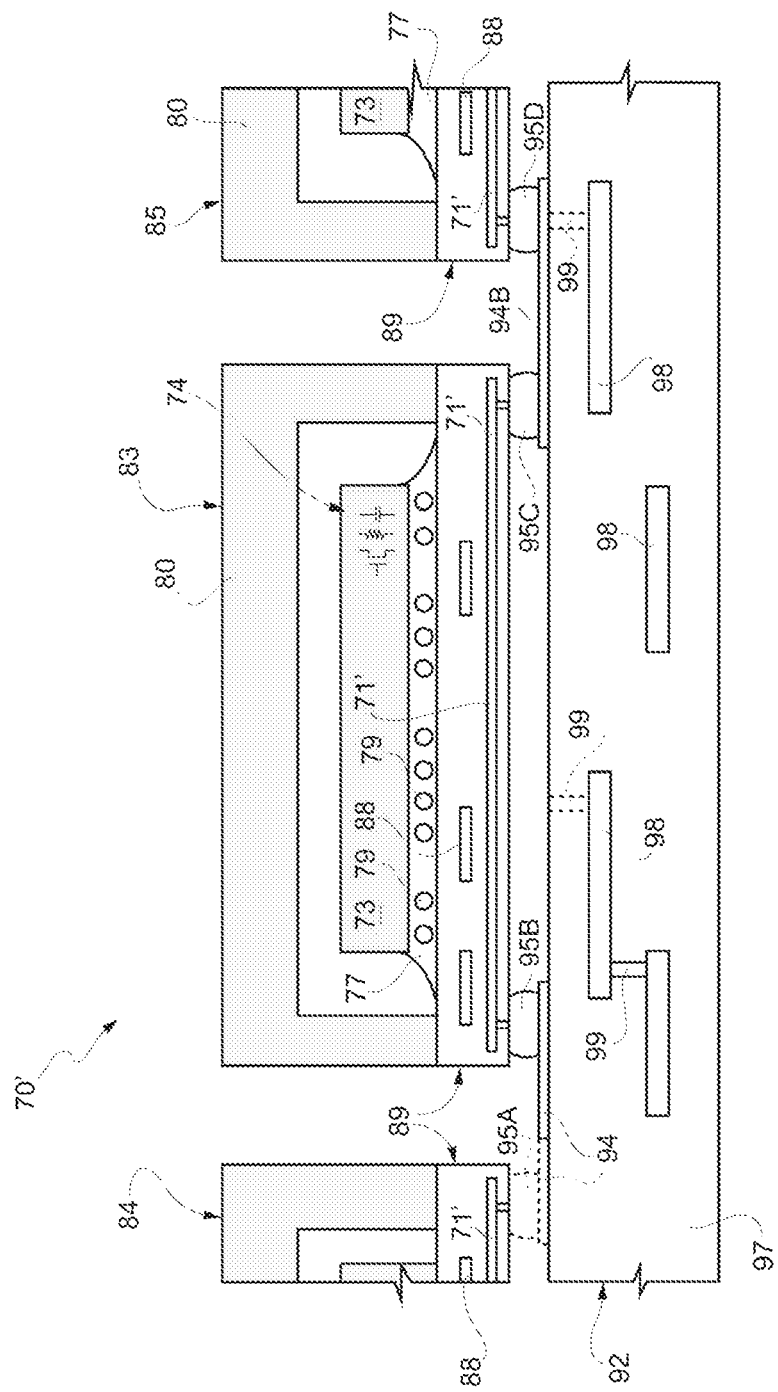
FIG. 10 is a different embodiment of the integrated circuit of FIG. 9, taken along the same section line as FIG. 9.

FIGS. 8-10 show an electronic device 70 implementing a different solution for routing the synchronization signal LO. Here, the MMICs comprise a microstrip (having a grounded region arranged underneath) or a coplanar waveguide (having grounded regions in the same plane as the waveguide). The microstrip or coplanar waveguide is formed above the dice, and extends practically throughout the width of each MMIC to connect opposite sides thereof. Connection with the terminals LOin and LOout is obtained through conductive tracks formed on the PCB and connected to the microstrip or coplanar waveguide through solder balls. This solution, shown in FIGS. 8 and 9 as regards bonding of the MMICs through the eWLB technique, may be used also in case of bonding of the MMICs with the FC-BGA technique, as discussed below.

In FIGS. 8 and 9, the MMICs (here designated by 83-86) have a coupling face 81, are formed as shown in FIG. 4, and each comprise a die 73 integrating electronic components (designated as a whole by 74), a peripheral region 76, and a dielectric layer 72. Metal connection lines 75, represented schematically, extend in the dielectric layer 72 and are connected with solder balls 95, as described above with reference to FIG. 4. Furthermore, also here, for clarity, the Slave MMICs 84-86 are referred to as first, second, and third Slave MMICs. It should be noted that here, albeit not shown, each die 73 derives from dicing a processed semiconductor wafer and comprises a semiconductor substrate (not shown) overlaid by one or more insulating layers (not shown) accommodating metal connection lines (not shown either), in a per se known manner.

Furthermore, as in FIG. 5, in FIG. 8, the MMICs 83-86 are arranged side-by-side, between a receiving antenna structure, RX antenna 90, and a transmitting antenna structure, TX antenna 91, and are coupled to the RX antenna 90 and TX antenna 91 through surface electrical connections 93 formed on the PCB (designated by 92) comprising, in a known way, a body 97 of dielectric material embedding conductive regions 98 connected together and to the first face 97A through metal vias 99.

Specifically, as regards the embodiment of FIGS. 8 and 9, each MMIC 83-86 has a conductive strip 71 formed in the dielectric layer 72 of the Master MIMIC 83 and of the Slave MMICs 84-86.

The conductive strips 71 are here formed using a redistribution layer RDL.

FIG. 10 shows a variant of FIG. 9, where the MMICs 83-86 are bonded using the FC-BGA technique.

Here, the electronic device, designated by 70', has conductive strips 71' formed in a metal layer similar to the ones used for forming metal connection lines 88, similar to the metal connection lines 18 of FIG. 3, within a connection substrate 89, similar to the connection substrate 7 of FIG. 3. In FIG. 10 the plates 8 are not shown, and the underfill layer, the bumps, and the caps are designated, respectively, by 77, 79, and 80.

In both cases of FIGS. 9 and 10, the conductive strips 71, 71' extend approximately throughout the width of the MMICs 83-86 (and thus of the dielectric layer 72 or of the connection substrate 89), ending only at a short distance from the edge thereof.

It should be noted that, in this context, the term width of the MMICs 53-56 indicates the size in the adjacency direction of the MMICs 53-56.

As shown in FIG. 8, the electronic device 70, 70' has a synchronization line 96 formed by the conductive strips 71, 71' of some of the MMICs 83-86 (the ones crossed by the synchronization line 96) and track portions 94 formed on the PCB 92. The conductive strips 71, 71' and the track portions 94 forming the synchronization line 96 are connected together by the solder balls 95.

In detail, the synchronization line 96 is here formed by the conductive strips 71, 71' of the Master MMIC 83 and of the second Slave MMIC 85 (arranged in FIGS. 9 and 10 to the right of the Master MMIC 83). The conductive strips 71, 71' are not electrically coupled to any of the components 74 and are connected to the respective solder balls 95 of only the Master MMIC 83 and the second Slave MMIC 85. Consequently, the conductive strips 71, 71' of the first Slave MMIC 84 (located furthest to the left in FIG. 8 and partially visible in FIGS. 9 and 10) and of the third Slave MMIC 56 (located furthest to the right in FIG. 8 and not visible in FIGS. 9 and 10) are floating (or connected to an appropriate fixed potential, for example, ground).

As an alternative to the above, the conductive strips 71, 71' of the first Slave MMIC 84 and of the third Slave MMIC 56 may be connected to respective solder balls 95, but these are not connected to any metal line, or are possibly connected only to a common ground line, if envisaged.

The track portions 94 formed on the PCB 92 enable connection of the synchronization line 96 to the input terminals LOin of the MMICs 83-86 and to the output terminal LOout of the Master MMIC 83. In detail, with reference to FIGS. 9 and 10, by identifying with 95A the solder ball coupled in a not shown way to the input terminal LOin of the first Slave MMIC 84 (represented dashed in FIGS. 9 and 10 in so far as it is not crossed by the section plane); by 95B the solder ball coupled to a first end (on the left in FIGS. 9 and 10) of the conductive strip 71, 71' of the Master MMIC 83; by 95C the solder ball coupled to a second end (on the right in FIGS. 9 and 10) of the conductive strip 71, 71' of the Master MMIC 83; and by 95D the solder ball coupled to a first end (on the left in FIGS. 9 and 10) of the conductive strip 71, 71' of the second Slave MMIC 85, a first track portion 94A connects the solder ball 95A of the Slave MMIC 85 to the solder ball 95B of the Master MMIC 83 and to a solder ball (not visible) coupled in a way not shown to the input terminal LOin of the Master MMIC 83; a second track portion 94B connects the solder ball 95C of the Master MMIC 53 to the solder ball 95D of the second Slave MMIC 85 and to a solder ball (not visible) coupled in a way not shown to the output terminal LOout of the Master MMIC 83; a third track portion 94C (shown only in FIG. 8) connects the second end of the conductive strip 71 of the second Slave MMIC 85 to solder balls (not visible) coupled to the input terminal LOin of the second Slave MMIC 85 and to the input terminal LOin of the third Slave MMIC 86.

It should be noted that this solution can be applied also in case of a wire-bonding/solder ball mixed technique, as evident to the person skilled in the art.

Figure 11:
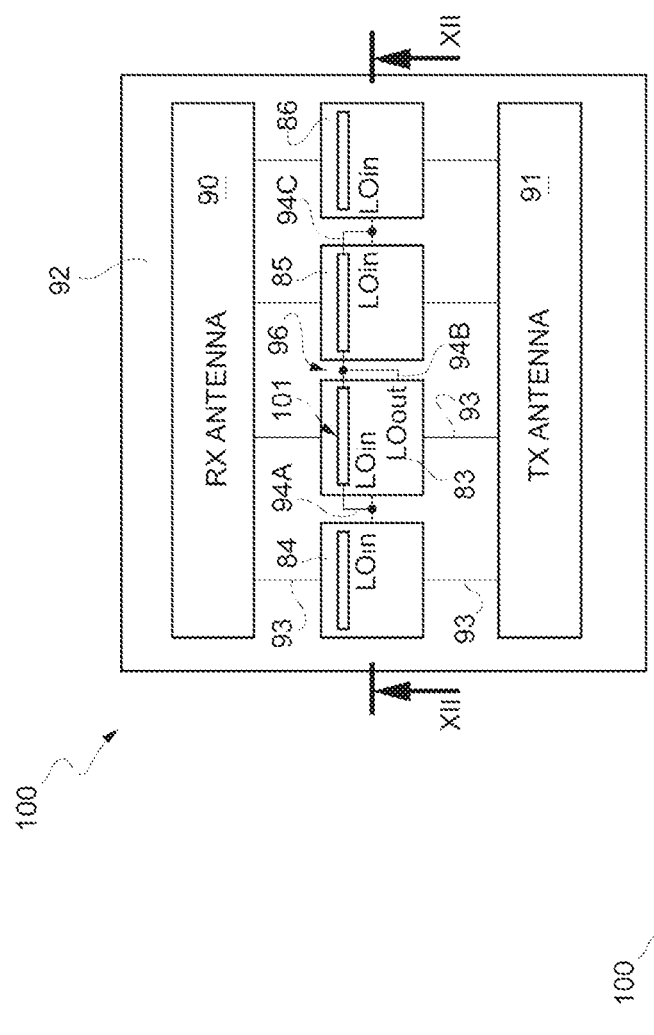
FIG. 11 shows the layout of an electronic device having a plurality of integrated circuits according to a different embodiment.
Figure 12:
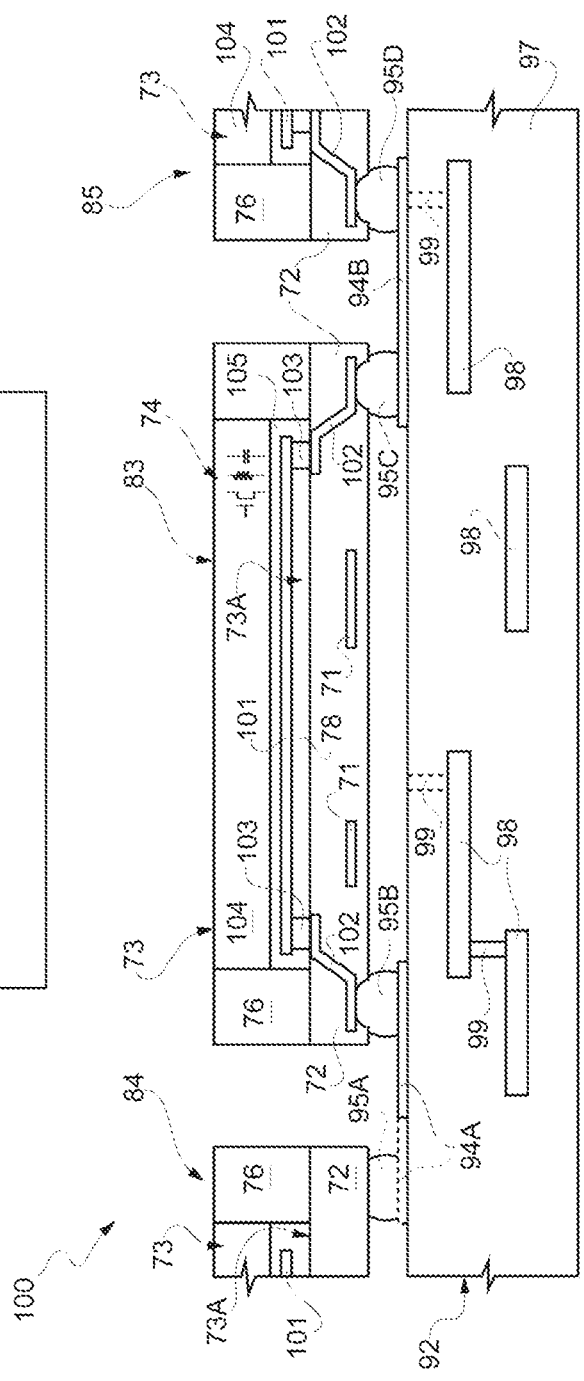
FIG. 12 is a cross-section of a portion of an integrated circuit of the electronic device of FIG. 11, taken along section line XII-XII.
Figure 13:
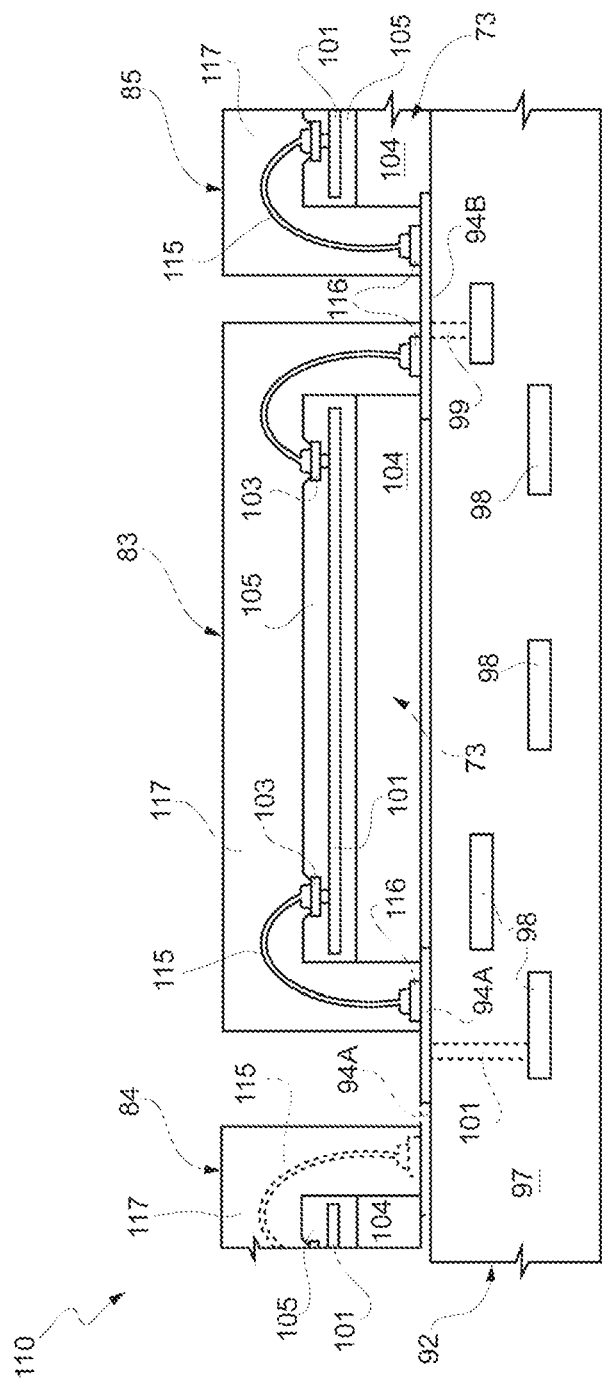
FIG. 13 is a cross-section of a different embodiment of the integrated circuit of FIG. 12, taken along the same section line as FIG. 12.

FIGS. 11-13 show an electronic device 100 implementing a different solution for routing the synchronization signal LO. Here, the MMICs have a microstrip or a coplanar waveguide integrated within the die, and the microstrip or coplanar waveguide extends throughout the width of each die to connect opposite sides thereof. Connection with the terminals LOin and LOout takes place through metal connection lines or wires internal to the MMICs and conductive tracks formed on the PCB. This solution, shown in FIGS. 11 and 12 as regards bonding the MMICs 83-86 through the eWLB technique, can be used also in the case of coupling of the MMICs 83-86 with the FC-BGA technique or with the wire-bonding technique, as discussed hereinafter with reference to FIG. 13.

In detail, as shown in FIGS. 11 and 12, where same parts of the electronic device 70 of FIGS. 8 and 9 are designated by the same reference numbers and are not described any further, and the dice 73 are represented as formed by a semiconductor substrate 104 overlaid by an insulation layer 105, each MMIC 83-86 has a conductive strip 101 of metal, here formed by a metallization layer extending within the insulating layer 105 of each die 73. Each conductive strip 101 is here formed directly underneath a surface 73A of the respective die 73. In case of the Master MMIC 83 and of the second Slave MMIC 85, each conductive strip 101 is connected at its own ends to respective solder balls 95 arranged on the edges of each MMIC 83, 85, by vias and contact pads 103 formed in the insulating layer 105, and respective metal connection lines 102 formed in the dielectric layer 72 and similar to the metal connection lines 71. In case of the first and third Slave MMICs 84, 86, the conductive strips 101 are not electrically connected to the electronic components 74 of the electronic device 100, as discussed above for the conductive strips 71, 71'.

In practice, in this case, the conductive strips 101 forming the microstrips or coplanar waveguides are manufactured at wafer level, together with the components 74, and are already present when the wafer is diced to the individual dice 73.

This solution may moreover be applied both in case of bonding using the FC-BGA bonding technique (in which case, the conductive strips 101 are electrically coupled to the solder balls 95 through bumps and a bonding support as shown in FIG. 10) and to electronic devices configured to work at low frequency and provided with packages coupled to a PCB by wire bonding (wire-bonding packages).

For instance, FIG. 13 shows an electronic device 110 having the connection scheme of FIG. 11, but where the MMICs are connected through wire bonding. Consequently, same parts with the electronic device 100 of FIGS. 11 and 12 are designated by the same reference numbers and are not described any further.

In particular, in the example shown in FIG. 13, each MMIC 83-86 comprises bonding wires 115 connecting respective contact pads 103 to pins 116. Also here, the contact pads 103 are arranged at opposite ends of the conductive strips 101; each conductive strip 101 is formed within the insulation layer 105 of each die 73 and extends practically throughout the width thereof. In FIG. 13, for simplicity, the insulation layer 105 is shown as a single layer covering the semiconductor substrate 104 of each die 72 and open only at the contact pads 103. However, the insulation layer 105 may be formed by different layers arranged on top of each other, in a known way.

The dice 73 and the bonding wires 115 are covered by a packaging layer 117 or a layer containing dielectric material, for example, molded resin (but the packaging layer may be formed according to any known packaging technique, as obvious to the person skilled in the art). The packaging layer 117 embeds also the pins 116 on all sides, except for the backside, where they are in direct electrical contact with the track portions 94 of the synchronization line 96.

As in FIG. 12, in FIG. 13 only the conductive strips 101 of the Master MMIC 83 and of the second Slave MMIC 85 are connected through the bonding wires 115. Consequently, the conductive strips 101 of the first and third MMICs 84, 86 are floating (or connected to an appropriate fixed potential, for example, ground). FIG. 13 thus shows with a dashed line (in so far as arranged in a parallel plane to the section plane) the bonding wire 115 connecting the input terminal LOin of the first Slave MMIC 84 to the first track portion 94A that is in electrical connection with an end of the conductive strip 101 of the Master MMIC 83, as explained above with reference to FIG. 11.

The MMICs and the electronic device described herein have numerous advantages.

In particular, the described solution allows the synchronization signal generated by the Master MIMIC to be carried to the Slave MMICs without requiring an additional connection level in the PCB scheme, and thus at low costs.

The described packaging structure allows the synchronization signal LO to be carried using (at least in part) the same conduction layer of the radiofrequency signals exchanged with the antenna structures 60, 61, 90, 91.

The path of the synchronization signal LO is simplified and may be minimal, thus reducing loss phenomena or layout complexity.

Finally, it is clear that modifications and variations may be made to the integrated circuit and to the electronic device described and shown herein, without thereby departing from the scope of the present disclosure. For instance, the described different embodiments may be combined so as to provide further solutions.

For example, the MMICs may be arranged also not aligned to each other, but simply arranged side-by-side between the RX and TX antenna structures. In this case, the synchronization track 70 may comprise a broken line.

The electronic device may comprise integrated circuits of a different type, even operating at different frequencies from radiofrequencies.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device, comprising:
 a printed circuit board (PCB) having a face;
 a plurality of integrated circuit packages, comprising:
  a die including semiconductor material and integrated electronic components, the die having a first side that is opposite to a second side;
  a connection region overlying the die, the connection region housing a plurality of connection lines and having a first face coupled to the die and a second face opposite the first face; and
  a plurality of solder balls, fixed to the second face of the connection region and electrically coupled to the electronic components through the connection lines, the solder balls being arranged in an array and being aligned along a plurality of lines parallel to a direction,
  wherein the plurality of lines includes an empty line extending from the first side to the second side along which no solder balls are present; and
 a conductive synchronization path extending over the face of the PCB and electrically coupled to at least a first solder ball of each integrated circuit package, the conductive synchronization path having at least a first portion extending along the empty line of at least one integrated circuit package of the plurality of integrated circuit packages.

2. The integrated circuit package according to claim 1, wherein first lines of the plurality of lines are spaced apart from one another by a first distance, and first adjacent lines of the plurality of lines and directly adjacent the empty line, are spaced apart from one another by a second distance, the second distance being greater than the first distance.

3. The integrated circuit package according to claim 2, wherein the second distance is twice the first distance.

4. The integrated circuit package according to claim 1, wherein the integrated circuit package is a Monolithic Microwave Integrated Circuit package.

5. An electronic device, comprising:
 a support having a face;
 a plurality of integrated circuits, each of the integrated circuits having integrated electronic components;
 a plurality of solder balls for each integrated circuit, the plurality of solder balls being electrically coupled to the electronic components of the respective integrated circuit and being fixed between the face of the support and the respective integrated circuit;
 antenna structures on the face of the support; and
 electric connection paths on the face of the support and electrically coupling the antenna structures to first solder balls of the plurality of solder balls of each integrated circuit;
 wherein the pluralities of solder balls of each integrated circuit are arranged in an array and are aligned along a plurality of lines parallel to a direction,
 the plurality of lines includes an empty line where no solder balls are present, and
 a conductive synchronization path extends over the face of the support and is electrically coupled to at least a first solder ball of each integrated circuit, the conductive synchronization path having at least a first portion extending along the empty line of at least one integrated circuit of the plurality of integrated circuits.

6. The electronic device according to claim 5, wherein the conductive synchronization path is laterally surrounded by the solder balls of the at least one integrated circuit of the plurality of integrated circuits.

7. The electronic device according to claim 5, wherein first lines of the plurality of lines are spaced apart from one another by a first distance, and adjacent lines of the plurality of lines and directly adjacent the empty line, are spaced apart from one another by a second distance, the second distance being greater than the first distance.

8. The electronic device according to claim 7, wherein the second distance is twice the length of the first distance.

9. The electronic device according to claim 5, wherein:

the at least one integrated circuit forms a master integrated circuit and includes an output terminal coupled to a second solder ball and configured to generate a synchronization signal;

the plurality of integrated circuits includes a first integrated circuit and a second slave integrated circuit, the first and the second slave integrated circuits being arranged on different sides of the master integrated circuit; and the conductive synchronization path has connection portions extending over the face of the support, branching off from the first portion and coupled to the first solder balls of the master integrated circuit and of the first and second slave integrated circuits.

10. The electronic device according to claim 9, wherein the connection portions include a first connection portion extending between the master integrated circuit and the first slave integrated circuit, a second connection portion extending between the master integrated circuit and the second slave integrated circuit, a third connection portion extending between the first portion and a respective first solder ball of the master integrated circuit, and a fourth connection portion extending between the second portion and the second solder ball of the master integrated circuit, the third and the fourth connection portions extending on opposite sides of the master integrated circuit.

11. The electronic device according to claim 5, wherein the solder balls form a Flip-Chip Ball-Grid-Array coupling or an embedded Wafer-Level BGA coupling.

12. The electronic device according to claim 5, wherein the plurality of integrated circuits are Monolithic Microwave Integrated Circuits.

13. The electronic device according to claim 5, wherein the electronic device is a microwave radar device.

14. A device, comprising:
a printed circuit board (PCB) having a surface; and
a plurality of semiconductor device packages physically coupled to the surface of the PCB, each semiconductor device package including:
a semiconductor die having integrated electronic components, the semiconductor die having a first edge that is opposite to a second edge;
a connection region on the semiconductor die, the connection region housing a plurality of connection lines and having a first face coupled to the semiconductor die and a second face opposite the first face; and
a plurality of solder balls connected to the second face of the connection region and electrically coupled to the electronic components through the connection lines, the solder balls being arranged in an array and being aligned along a plurality of lines parallel to a direction,
wherein the plurality of lines includes an empty line that extends completely between the first edge and the second edge in which no solder balls are present; and
a synchronization path extends over the surface of the PCB and is electrically coupled to at least a first solder ball of each semiconductor device package, the synchronization path having a first portion extending along the empty line of at least one semiconductor device package of the plurality of semiconductor device packages.

15. The device according to claim 14, wherein first lines of the plurality of lines are spaced apart from one another by a first distance, and first adjacent lines of the plurality of lines and directly adjacent the empty line, are spaced apart from one another by a second distance, the second distance being greater than the first distance.

16. The device according to claim 15, wherein the second distance is twice the first distance.

17. The device according to claim 15, wherein the semiconductor device package is a Monolithic Microwave Integrated Circuit package.

18. The device according to claim 15, wherein the plurality of solder balls form a Flip-Chip Ball-Grid-Array coupling or an embedded Wafer-Level BGA coupling.

19. The device according to claim 15, wherein the device is a microwave radar device.

20. The device according to claim 15, further comprising an antenna on the surface of the PCB and electrically coupled to the semiconductor device package.

* * * * *